(12) United States Patent
Friend et al.

(10) Patent No.: US 10,088,519 B1
(45) Date of Patent: Oct. 2, 2018

(54) ELECTROMIGRATION MONITOR (71) Applicant: International Business Machines Corporation, Armonk, NY (US)

(72) Inventors: David M. Friend, Stewartville, MN (US); Grant P. Kesselring, Rochester, MN (US); Eric J. Lukes, Stewartville, MN (US); James D. Strom, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/486,388

(22) Filed: Apr. 13, 2017

(51) Int. Cl.
| G01R 31/3187 | (2006.01) |
| G01R 31/28 | (2006.01) |
| H01L 21/66 | (2006.01) |
| H03L 7/08 | (2006.01) |

(52) U.S. Cl.
CPC ..... *G01R 31/2858* (2013.01); *G01R 31/2884* (2013.01); *H01L 22/26* (2013.01); *H03L 7/08* (2013.01)

(58) Field of Classification Search
CPC .............. G01R 19/257; G01R 31/2884; G01R 31/3004; G01R 31/3181; G01R 31/31813; G01R 1/0416; G01R 1/0466; G01R 1/06705; G01R 1/18; G01R 31/2886
See application file for complete search history.

(56) References Cited

U.S. PATENT DOCUMENTS

| 6,374,188 | B1* | 4/2002 | Hubbard ............ G01R 19/2513 |
| | | | 702/61 |
| 2007/0164768 | A1 | 7/2007 | Hsu et al. |
| 2009/0045881 | A1 | 2/2009 | Logan |
| 2010/0045326 | A1 | 2/2010 | Archer, III et al. |
| 2015/0192634 | A1* | 7/2015 | Lewis ................ G01R 31/2621 |
| | | | 324/762.09 |

\* cited by examiner

*Primary Examiner* — Tung X Nguyen
(74) *Attorney, Agent, or Firm* — Patterson + Sheridan, LLP (57) ABSTRACT

The present disclosure discloses an IC with an electromigration (EM) monitor. The IC includes a functional circuit configured according to a first value of a parameter related to EM tolerance. The IC also includes a dummy version of the functional circuit configured according to a second value of the parameter. The second value causes the dummy version of the functional circuit to be more sensitive to an EM event than the functional circuit. Upon the EM monitor determines that the EM event occurs in the dummy version of the functional circuit, the EM monitor asserts a signal indicating that the EM event has occurred in the dummy version of the functional circuit and providing a warning that the EM event is likely to occur in the functional circuit.

20 Claims, 5 Drawing Sheets

ELECTROMIGRATION MONITOR

BACKGROUND

Electromigration (EM) is the transport of material caused by the gradual movement of the ions in a conductor due to the momentum transfer between conducting electrons and diffusing metal atoms. EM can cause circuit elements to fail in integrated chips (ICs). Due to advances in manufacturing processes, the structure size in ICs decreases continuously. As the structure size in ICs decreases, the ICs are more sensitive to EM. Thus, there is a need to predict EM events that may occur in the ICs to avoid circuit failure in the ICs.

SUMMARY

One embodiment of the present disclosure provides an integrated circuit. The integrated circuit includes a functional circuit comprising a plurality of components and configured according to a first value of a parameter related to electro migration (EM) tolerance. The integrated circuit also includes a dummy version of the functional circuit comprising the plurality of components and configured according to a second value of the parameter, wherein the second value causes the dummy version of the functional circuit to be more sensitive to an EM event than the functional circuit. The integrated circuit further includes logic coupled between the dummy version of the functional circuit and an I/O interface of the integrated circuit, wherein the logic is configured to: upon determining that the EM event occurs in the dummy version of the functional circuit, assert a signal at the I/O interface indicating that the EM event has occurred in the dummy version of the functional circuit.

Another embodiment of the present disclosure provides an EM monitor. The EM monitor includes a dummy version of a functional circuit comprising a plurality of components in an integrated circuit, wherein the functional circuit is configured according to a first value of a parameter related to EM tolerance, wherein the dummy version of the functional circuit is configured according to a second value of the parameter, and wherein the second value causes the dummy version of the functional circuit to be more sensitive to an EM event than the functional circuit. The EM monitor also includes logic coupled between the dummy version of the functional circuit and an I/O interface of the integrated circuit, wherein the logic is configured to: upon determining that the EM event occurs in the dummy version of the functional circuit, assert a signal at the I/O interface indicating that the EM event has occurred in the dummy version of the functional circuit.

Another embodiment of the present disclosure provides a method. The method includes configuring a functional circuit comprising a plurality of components in an integrated circuit (IC) according to a first value of a parameter related to electro migration (EM) tolerance. The Method also includes configuring a dummy version of the functional circuit comprising the plurality of components in the IC according to a second value of the parameter, wherein the second value causes the dummy version of the functional circuit to be more sensitive to an EM event than the functional circuit. The method further includes, upon determining that the EM event occurs in the dummy version of the functional circuit, asserting a signal indicating that the EM event has occurred in the dummy version of the functional circuit.

BRIEF DESCRIPTION OF THE SEVERAL VIEWS OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Many ICs are designed without a EM monitoring function. Thus, in order to avoid EM events in the ICs, the ICs are usually over-designed to be more robust to EM events, e.g., by using more metal connectors to an electrode, e.g., a gate, drain or source of transistors in the ICs. Over-design of the ICs may increase the manufacturing costs of the ICs. With EM monitoring function in the ICs according to the embodiments described herein, over-design of the ICs can be avoided in at least some cases, thereby reducing the size and complexity of the ICs.

The embodiments herein describe an IC that includes an EM monitor. In one embodiment, the EM monitor includes a dummy version of a functional circuit in the IC. For example, the IC may include a phase lock loop (PLL) that is used to generate an output signal whose phase matches the phase of an input signal. The EM monitor in the IC includes a dummy version of the PLL. The dummy version of the functional circuit is designed or configured to be more sensitive to EM events than the actual functional circuit. For example, when the functional circuit and the dummy version of the functional circuit operate in parallel according to respective configurations, an EM event occurs in the dummy version of the functional circuit earlier than in the functional circuit. If the EM monitor detects that an EM event occurred in the dummy version of the functional circuit, the EM monitor asserts a warning signal indicating that the EM event has occurred in the dummy version of the functional circuit and serves as a warning that the EM event is likely to occur in the actual functional circuit. The present disclosure provides embodiments to monitor an EM event occurring in the dummy version of the functional circuit and predict that the EM event is likely to occur in the actual functional circuit.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 1:
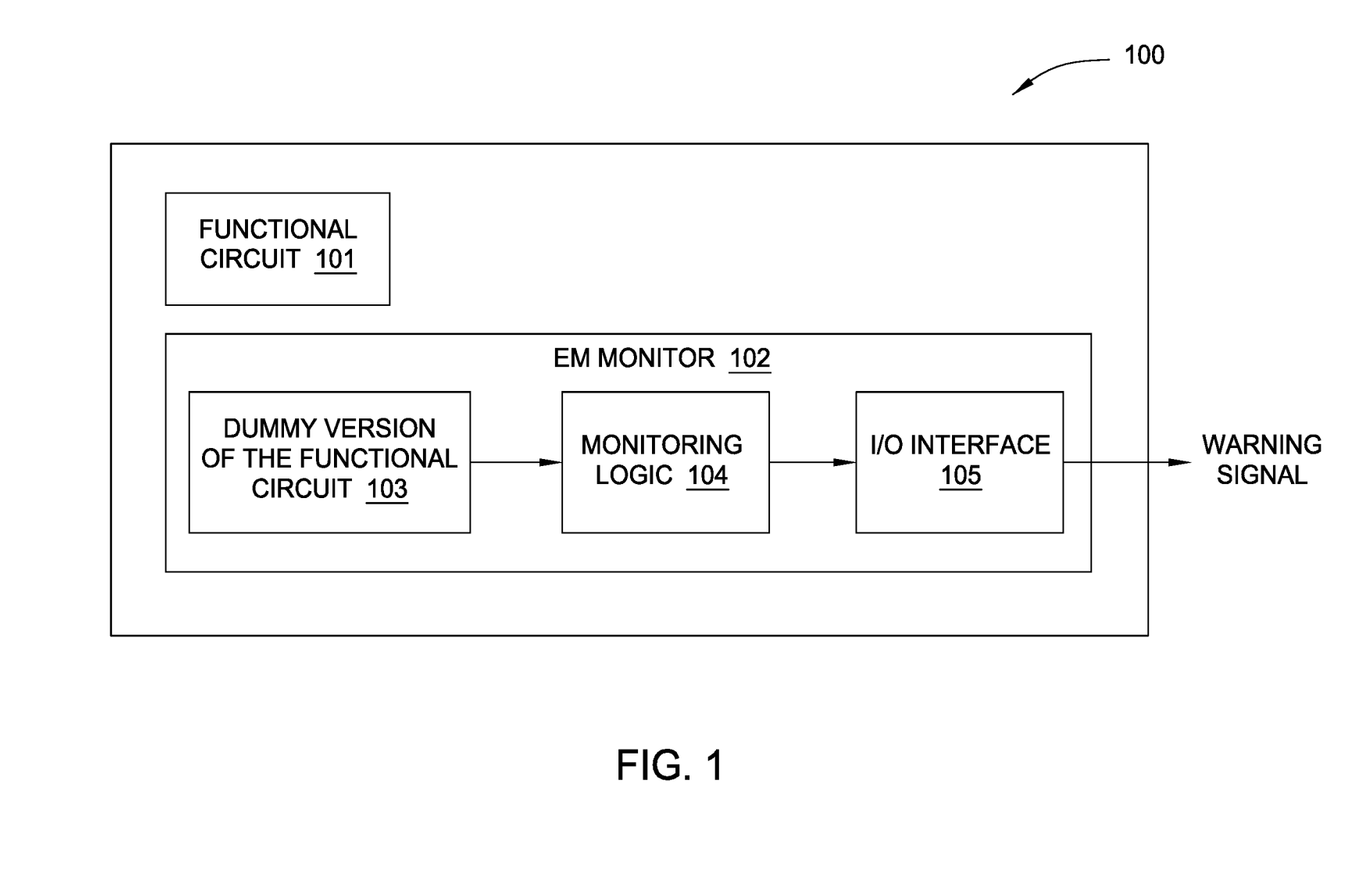
FIG. 1 illustrates an IC, according to one embodiment herein.

FIG. 1 shows an IC 100, according to one embodiment herein. The IC 100 includes a functional circuit 101. The functional circuit 101 performs one or more functions for the IC 100. That is, the IC 100 is designed to use the one or more functions performed by the functional circuit 101 such as the phase lock function or the clock signal generating function. In one embodiment, the functional circuit 101 is a PLL. That is, the IC 100 is designed to use the functional circuit 101 to perform the PLL's functions. A PLL is sensitive to EM events mainly because the PLL operates at a much higher frequency than other circuits in the IC 100. For example, the PLL may operate at 26 GHz frequency while other circuits in the IC 100 work at 5 GHz or even lower frequencies.

The IC 100 also includes an EM monitor 102. The EM monitor 102 includes a dummy version of the functional circuit, denoted as 103 in FIG. 1. In one embodiment, the circuit 103 is the same as the functional circuit 101. The circuit 103 can perform the same functions as the functional circuit 101. However, in one embodiment, the IC 100 does not use the functions performed by the circuit 103. That is, the circuit 103 is a dummy version of the functional circuit 101. For example, the functional circuit 101 can be a PLL, and the dummy circuit 103 can be the same PLL as the functional circuit 101. Stated differently, the dummy circuit 103 can include the same components and circuit elements as the functional circuit 101. Thus, the circuit 103 can perform all the PLL's functions as the functional circuit 101. However, the IC 100 does not use the circuit 103 to perform the PLL's functions for the IC 100. In one embodiment, the circuit 103 is physically located close to the functional circuit 101 in the IC 100. For example, the circuit 103 can be directly attached or coupled to the functional circuit 101.

The EM monitor 102 also includes a monitoring logic 104. The monitoring logic 104 monitors whether an EM event has occurred in the circuit 103. The EM monitor 102 further includes an I/O interface 105. Upon detecting that an EM event occurs in the circuit 103, the monitoring logic 104 generates and sends a warning signal to the I/O interface 105 indicating that the EM event has occurred in the circuit 103. The I/O interface 105 outputs the warning signal to the user or the manufacturer of the IC 100. In one embodiment, the I/O interface 105 is a dedicated I/O interface on the EM monitor 102. In another embodiment, the I/O interface 105 is an existing I/O interface on the IC 100 which is shared by the EM monitor 102 and other components in the IC 100.

FIG. 1 shows only one embodiment. In another embodiment, the circuit 103 is included inside the functional circuit 101. That is, the functional circuit 101 includes a dummy version of itself.

Figure 2:
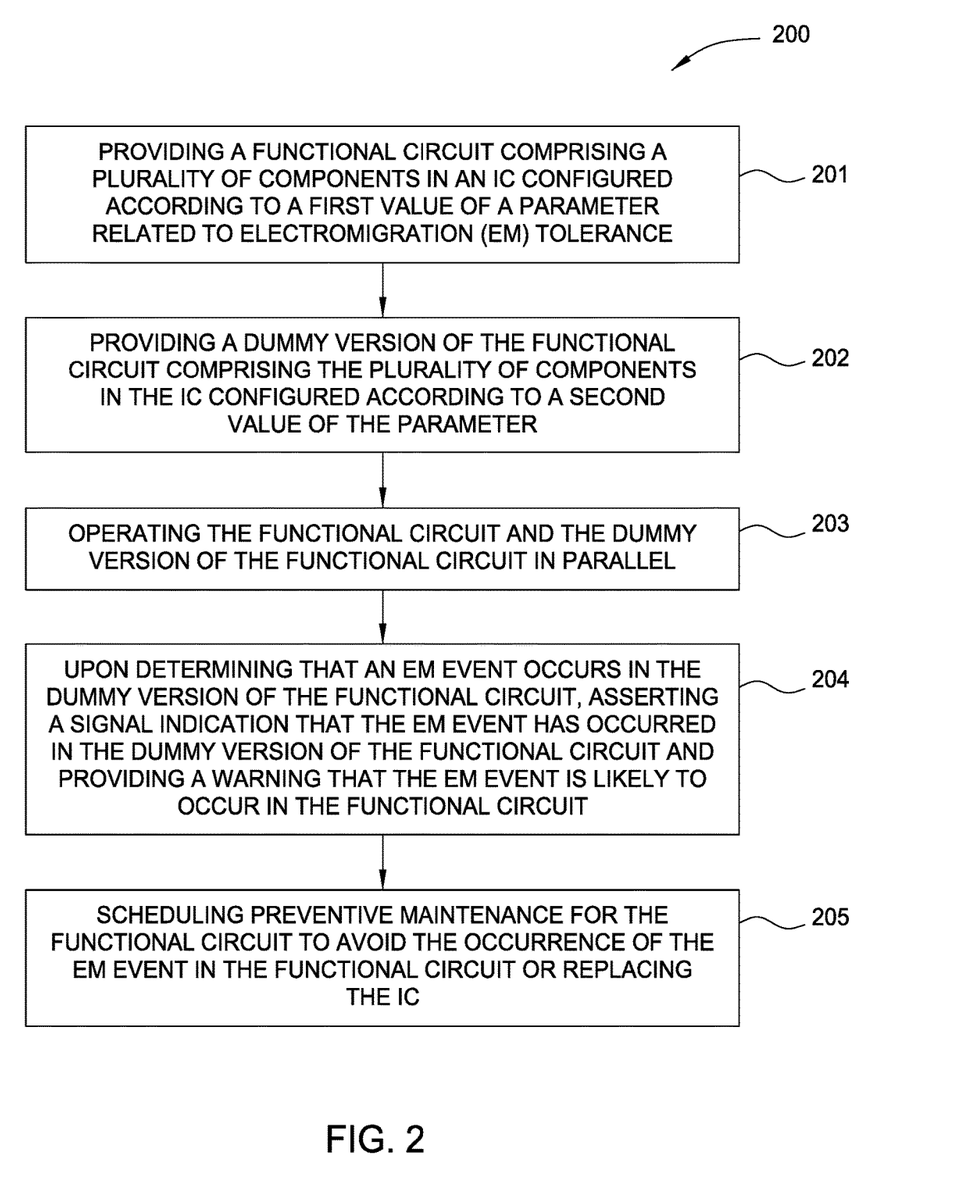
FIG. 2 illustrates a flowchart showing a method for monitoring an EM event in the IC, according to one embodiment herein.

FIG. 2 is flowchart showing a method 200 for monitoring an EM event in the IC 100, according to one embodiment herein. The method 200 is explained by using FIG. 1. For this explanation of FIG. 2, it is assumed that in FIG. 1, the functional circuit 101 is a PLL and the circuit 103 is a dummy PLL.

At block 201, the IC 100 includes or provides a functional circuit comprising a plurality of components and configured according to a first value of a parameter related to EM tolerance. For example, the functional circuit 101 may include components such as oscillators, buffers, frequency divider, regulator and operational amplifier (op-amp) to form the PLL.

At block 201, the functional circuit is designed or configured according to a first value of a parameter related to EM tolerance. For example, the functional circuit 101 is designed by using metal lines and/or vertical interconnect accesses (VIAs) with a width, e.g., 2 microns, to connect the plurality of components in the functional circuit 101. A circuit is more robust to EM events when the width of the metal lines is wider. Thus, the width of the metal lines in the functional circuit 101 is a parameter indicating the level of EM tolerance by the functional circuit 101. In another example, the functional circuit 101 is designed by using a number of transistor contacts, e.g., 20 contacts, for each source and/or drain region of the transistors in the functional circuit 101. The contacts are made by materials such as Tungsten or Aluminum to connect the transistors' source and/or drain regions to other metal components in the functional circuit 101. In one embodiment, the contacts can be the drain contacts and/or the source contacts for the transistors. A circuit is more robust to EM events when the number of transistor contacts is larger. Thus, the number of transistor contacts in the functional circuit 101 can be another parameter indicating the level of EM tolerance by the functional circuit 101.

At block 202, the IC 100 includes or provides a dummy version of the functional circuit comprising the plurality of components and configured according to a second value of the parameter. For example, as shown in FIG. 1, the EM monitor 102 in the IC 100 includes the circuit 103, which is a dummy PLL. The circuit 103 includes the same plurality of components as the functional circuit 101. That is, the circuit 103 may include the same components such as oscillators, buffers, frequency divider, regulator and op-amp to form the PLL as the functional circuit 101, which will be described in detail below.

At block 202, the circuit 103 is designed or configured according to a second value of the parameter related to EM tolerance. For example, the circuit 103 is designed by using metal lines with a width, e.g., 1.5 microns, to connect the plurality of components in the circuit 103. As explained above, a circuit is more robust to EM events when the width of the metal lines is wider. Thus, because the width of the metal lines, e.g., 1.5 microns, used by the circuit 103 is narrower than the width of the metal lines, e.g., 2 microns, used by the functional circuit 101, the circuit 103 is more sensitive to EM events than the functional circuit 101. In other words, the circuit 103 is more likely to experience EM events than the functional circuit 101. In another example, the circuit 103 is designed by using a number of transistor contacts, e.g., 16 contacts, for each source and/or drain region of the transistors in the circuit 103. As explained above, a circuit is more robust to EM events when the number of transistor contacts is larger. Thus, because the number of transistor contacts, e.g., 16 contacts, for each source and/or drain region of the transistors in the circuit 103 is less than the number of transistor contacts, e.g., 20 contacts, for each source and/or drain region of the transistors in the functional circuit 101, the circuit 103 is more sensitive to EM events than the functional circuit 101. In other words, the circuit 103 is more likely to experience EM events than the functional circuit 101.

At block 203, the IC 100 operates the functional circuit and the dummy version of the functional circuit in parallel. For example, the IC 100 operates the functional circuit 101 and the circuit 103 in parallel. In one embodiment, the IC 100 operates the functional circuit 101 to perform the PLL's functions for the IC 100. However, the IC 100 operates the circuit 103 only for EM monitoring purpose. That is, the circuit 103 operates as a PLL. However, the IC 100 does not use the circuit 103 to perform the PLL's functions for the IC 100. For example, the output of the PLL that is the functional circuit 101 may be used to drive a clocking network in the IC 100 while any outputs from the components in the PLL of the circuit 103 are not used.

At block 204, upon determining that an EM event occurs in the dummy version of the functional circuit, the EM monitor 102 in the IC 100 asserts a signal indicating that the EM event has occurred in the dummy version of the functional circuit which provides a warning that the EM event is likely to occur in the functional circuit. For example, the monitoring logic 104 monitors whether an EM event has occurred in the circuit 103. Upon detecting that an EM event occurs in the circuit 103, the monitoring logic 104 generates and sends a warning signal to the I/O interface 105 indicating that the EM event has occurred in the circuit 103. Because the circuit 103 is more sensitive to EM events than the functional circuit 101, the occurrence of the EM event in the circuit 103 indicates that the EM event is also likely to occur in the functional circuit 101. Thus, the warning signal provides a warning that the EM event is likely to occur in the functional circuit 101. The I/O interface 105 outputs the warning signal to the user or the manufacturer of the IC 100.

At block 205, upon receiving the warning signal, the user or the manufacturer of the IC 100 makes decisions to schedule preventive maintenance for the functional circuit to avoid the occurrence of the EM event in the functional circuit or replace the IC. For example, the EM event that occurred in the circuit 103 may be caused by high temperature of the circuit 103; thus, one example of preventive maintenance is to use stronger fans in the system to cool down the functional circuit 101 or the IC 100. When the temperature is sufficiently reduced, the EM event may not occur in the functional circuit 101. If preventive maintenance does not work or is not feasible, the user or manufacturer of the IC 100 may simply decide to replace the IC 100 with a new IC or replace the field-replaceable unit (FRU) including the IC 100 with a new FRU. In one embodiment, the warning signal is sent from the user of the IC 100 to a remote server of the manufacturer of the IC 100 through a network, e.g., the Internet. After receiving the warning signal, the manufacturer of the IC 100 can send technicians to perform the preventive maintenance or replace the IC 100 for the user. In another embodiment, when the warning signal is emitted, the technician may add a backup chip for the IC 100 or a backup FRU including the backup chip into the same computing system. In one example, the backup chip can be a replica of the IC 100. When the IC 100 fails due to the occurrence of the EM event in the functional circuit 101 in the IC 100, the system activates the backup chip or the backup FRU to perform the functions or tasks of the IC 100.

FIG. 2 shows only one embodiment. In another embodiment, the functional circuit 101 and/or the circuit 103 can be designed using different values of the parameters related to EM tolerance. For example, the circuit 103 can be designed by using metal lines with a width of 1.8 microns (instead of 1.5 microns as described above) or by using 17 transistor contacts (instead of 16 transistor contacts as described above) for each source and/or drain region of the transistors in the circuit 103. In another embodiment, the circuit 103 can be designed using less values of both the width of the metal lines and the number of the transistor contacts than the functional circuit 101. In another embodiment, the values of the parameters used by the circuit 103 cause the circuit 103 to be slightly more sensitive to an EM event than the functional circuit 101. Thus, the occurrence of the EM event in the circuit 103 indicates that the EM event is also likely to occur in the functional circuit 101 within an expected time period, e.g., 4 hours. In another embodiment, the parameters related to EM tolerance can be other parameters indicating the level of EM tolerance by the circuits as known in the art. For example, one parameter can be operating power of the functional circuit 101 and/or the circuit 103. For example, the circuit 103 can be a scaled lower power version of the functional circuit 101. The circuit 103 can operate at a lower power than the functional circuit 101 using equal or less values of the width of the metal lines and/or the number of the transistor contacts than the functional circuit 101.

Figure 3A:
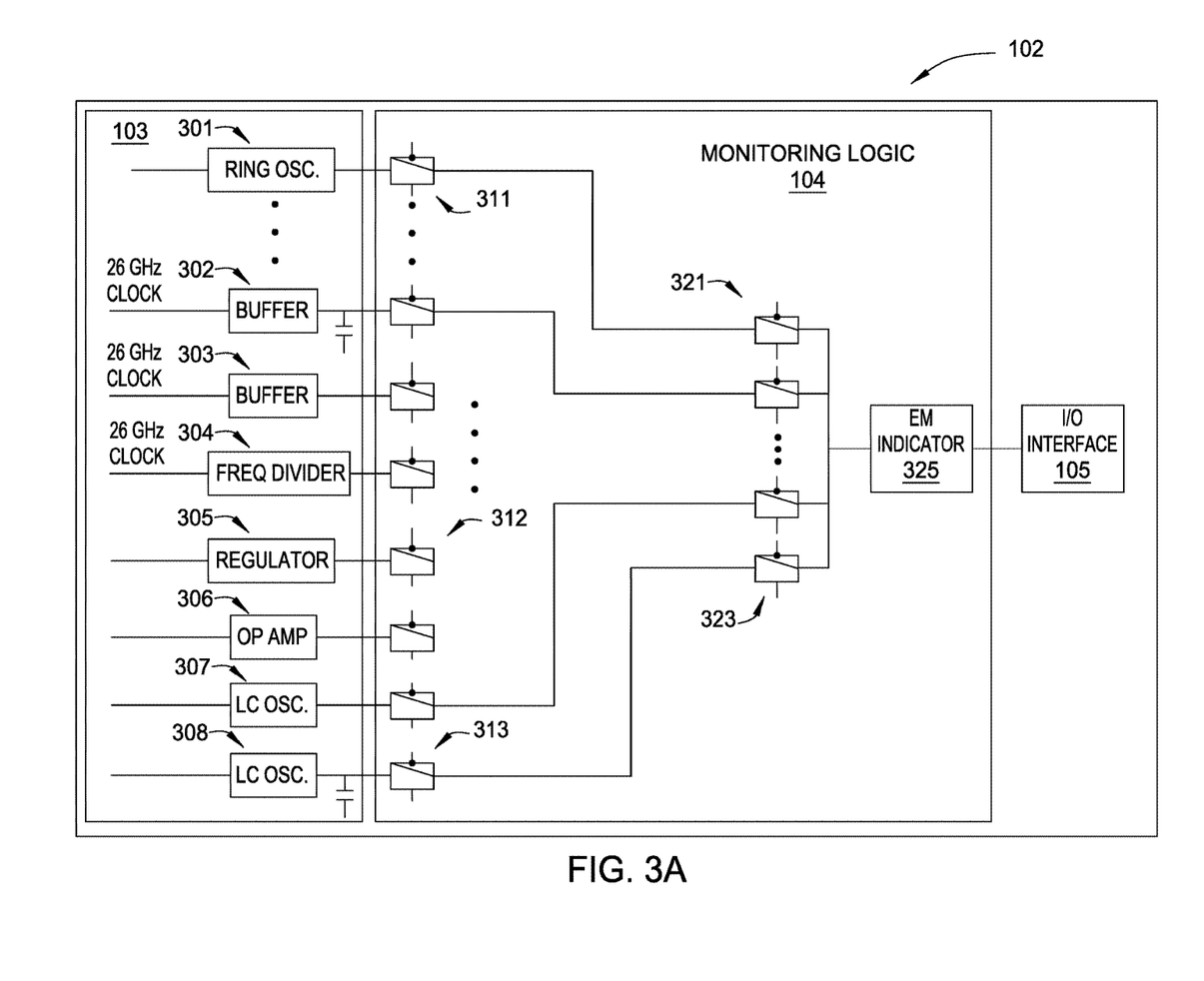
FIG. 3A illustrates an EM monitor, according to one embodiment herein.

FIG. 3A illustrates the EM monitor 102, according to one embodiment herein. In FIG. 3A, the circuit 103 is a dummy version of a PLL. That is, in this embodiment, in the IC 100, the functional circuit 101 is a PLL including a plurality of components and the circuit 103 is a dummy version of the PLL including the same plurality of components. As shown in in FIG. 3A, the circuit 103 includes a ring oscillator 301, buffers 302 and 303 with input clock signals at 26 GHz frequency, a frequency divider 304 with input clock signals at 26 GHz frequency, a regulator 305, an op-amp 306, and inductor-capacitor (LC) oscillators 307 and 308. In one embodiment, the functional circuit 101 includes the same plurality of components (not shown in FIG. 3A). The components in circuit 103 form a PLL. As explained above, the circuit 103 is designed or configured to be more sensitive to EM events than the functional circuit 101. For example, comparing to the functional circuit 101, the circuit 103 is designed by using less values of the width of the metal lines and/or the number of the transistor contacts than the functional circuit 101.

The EM monitor 102 also includes the monitoring logic 104. In one embodiment, the monitoring logic 104 includes a plurality of selectors, e.g., multiplexers or switches. Each component in the circuit 103 is connected to a selector. For examples, as shown in FIG. 3A, the ring oscillator 301 is connected to the selector 311, the regulator 305 is connected to the selector 312 and the oscillator 308 is connected to the selector 313. In one embodiment, the monitoring logic 104 includes two-level selectors. The wires connecting the two-level selectors can be very long and the two-level selectors prevent high frequency signals transmitted on the wires from getting attenuated. For examples, as shown in FIG. 3A, the selector 311 is connected to the second-level selector 321 and the selector 313 is connected to the second-level selector 323.

The output signal from each component in the circuit 103 is input to the connected selector. For examples, the output signal from the ring oscillator 301 is input to the connected selector 311 and the output signal from the regulator 305 is input to the connected selector 312. The output signals from the selectors are input to an EM indicator 325 in the monitoring logic 104. For example, as shown in FIG. 3A, the output signals from the second-level selectors, e.g., the selectors 321 and 323, are input to the EM indicator 325.

In one embodiment, the EM indicator 325 measures the output signals from one of the components in the circuit 103 to determine whether an EM event has occurred in the circuit 103. For example, the EM indicator 325 can select to measure the output voltage using the output signal of the regulator 305. In this example, the two-level selectors between the regulator 305 and the EM indicator 325 are enabled to select the output signal of the regulator 305 and transmit the output signal of the regulator 305 to the EM indicator 325. The EM indicator 325 does not select the output signals from other components in the circuit 103 to measure. That is, the two-level selectors between other components in the circuit 103 and the EM indicator 325 are disabled to not select the output signal of the other components in the circuit 103.

If the EM indicator 325 detects that the output voltage of the regulator 305 is below a predetermined threshold, the EM indicator 325 can make a decision that an EM event has occurred in the regulator 305 and send a warning signal to the I/O interface 105 in the EM monitor 102. In other embodiments, the EM indicator 325 can select to measure the output signal of a different component in the circuit 103. For examples, the EM indicator 325 can select to measure the output voltage using the output signal of the op-amp 306 or select to measure the frequency using the output signal of the ring oscillator 301, as understood by an ordinary person in the art. In one embodiment, the EM indicator 325 selects to measure the output signal of a component in the circuit 103 based on which component in the circuit 103 is more sensitive to EM events.

In another embodiment, the EM indicator 325 measures the output signals from multiple or all the plurality of components in the circuit 103 to determine whether an EM event has occurred in the circuit 103. For example, the EM indicator 325 can measure the output signals from the 8 components 301 to 308 in the circuit 103. That is, the two-level selectors between the 8 components 301 to 308 and the EM indicator 325 are all enabled to select the output signals of the 8 components 301 to 308 and transmit the output signals of the 8 components 301 to 308 to the EM indicator 325. If the output signal from any of the 8 components indicates that an EM event has occurred in the component, the EM indicator 325 can make a decision that an EM event has occurred in the circuit 103 and send a warning signal to the I/O interface 105 in the EM monitor 102. For example, the EM indicator 325 can measure the output signals from the 8 components 301 to 308 in the circuit 103. If the output voltage of the op-amp 306 is below a predetermined threshold, the EM indicator 325 can make a decision that an EM event has occurred in the op-amp 306 and send a warning signal to the I/O interface 105 in the EM monitor 102.

In one embodiment, the EM indicator 325 sends a warning signal to the I/O interface 105 indicating that the EM event has occurred in one component of the circuit 103. For example, the EM indicator 325 can identify that the regulator 305 is selected by the selectors and send a warning signal to the I/O interface 105 indicating that the EM event has occurred in the regulator 305. In another embodiment, the EM indicator 325 sends a warning signal to the I/O interface 105 indicating that the EM event has occurred in the circuit 103 without indicating which component of the circuit 103 has experienced the EM event.

In one embodiment, the warning signal sent from the EM indicator 325 to the I/O interface 105 is a simple "0" or "1" indication, e.g., a signal representing one bit. For example, "0" indicates that there is no EM event occurred in the circuit 103 and "1" indicates that an EM event has occurred in the circuit 103. In one embodiment, the EM indicator 325 generates the warning signal with "0" or "1" indication by using a lock detector in the circuit 103. For example, if the circuit 103 (a dummy PLL) failed to lock phases due to the occurrence of the EM event in at least one component in the circuit 103, the lock detector indicates the failure to the EM indicator 325. The EM indicator 325 can generate the warning signal to indicate that an EM event has occurred in the circuit 103.

FIG. 3A shows only one embodiment. In other embodiments, the circuit 103 can include additional or less components than the components 301-308 as shown in FIG. 3A to form the PLL. For example, circuit 103 can also include level shifters, as understood in the art. In other embodiments, the monitoring logic 104 includes only single-level selectors between the components in the circuit 103 and the EM indicator 325. For example, the second-level selectors, e.g., the selectors 321 and 323 are not needed. In other embodiments, the monitoring logic 104 includes more than two-level selectors between the components in the circuit 103 and the EM indicator 325. For example, the monitoring logic 104 can include three-level selectors between the components in the circuit 103 and the EM indicator 325. In other embodiments, the circuit 103 can be a dummy version of a different functional circuit. For example, the circuit 103 can be a dummy version of a clock generator or a memory element. In this example, the circuit 103 includes components to form a clock generator or a memory element. The components in the circuit 103 to form a clock generator or a memory element can be different from the components 301-308 as shown in FIG. 3A.

Figure 3B:
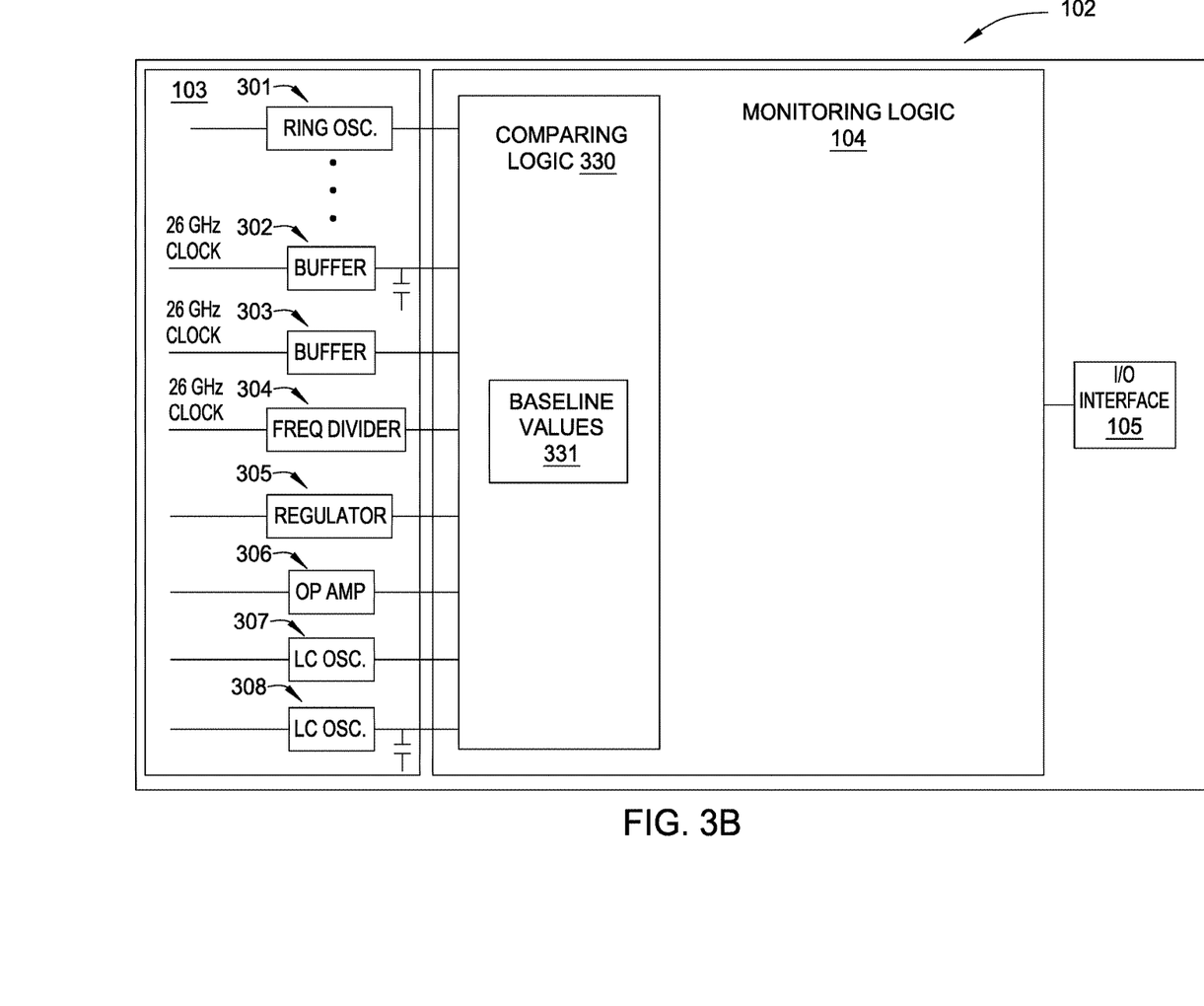
FIG. 3B illustrates an EM monitor, according to another embodiment herein.

FIG. 3B illustrates the EM monitor 102, according to another embodiment herein. In FIG. 3B, the circuit 103 is a dummy version of a PLL including the plurality of components as shown in FIG. 3A. As explained above, the circuit 103 is designed or configured to be more sensitive to EM events than the functional circuit 101. The monitoring logic 104 includes a comparing logic 330. Output signals from one or more of the plurality of components in the circuit 103 are input to the comparing logic 330. The comparing logic 330 compares the output signals from one or more components in the circuit 103 with the baseline values 331 stored in the comparing logic 330. The comparing results indicate whether an EM event has occurred in the circuit 103. For example, the comparing logic 330 compares the output voltage of the regulator 305 with a predetermined threshold of output voltage stored in the baseline values 331. If the output voltage of the regulator 305 is below the predetermined threshold, the comparing logic 330 sends a warning signal to the I/O interface 105 indicating that an EM event has occurred in the regulator 305 or in the circuit 103, similarly as described above.

In other embodiments, the EM monitor 102 can include both the selectors as shown in FIG. 3A and the comparing logic 330 as shown in FIG. 3B. For example, the EM monitor 102 can include the comparing logic 330 between the components 301-308 and the selectors. The comparing logic 330 compares the output signals from one or more of the plurality of components in the circuit 103 with the baseline values 331 and sends the comparing results to the selectors. The selectors can select one or more comparing results indicating the occurrence of an EM event in the circuit 103 to the EM indicator 325. Based on the received comparing results, the EM indicator 325 can generate and send the warning signal to the I/O interface 105. For example, the comparing results show that the output voltage of the regulator 305 is below the predetermined threshold. The comparing logic 330 outputs the comparing result for the regulator 305 to the selector 312. The selector 312 sends the comparing result for the regulator 305 to the EM indicator 325 to generate the warning signal to indicate that an EM event has occurred in the regulator 305 or in circuit 103.

Figure 4:
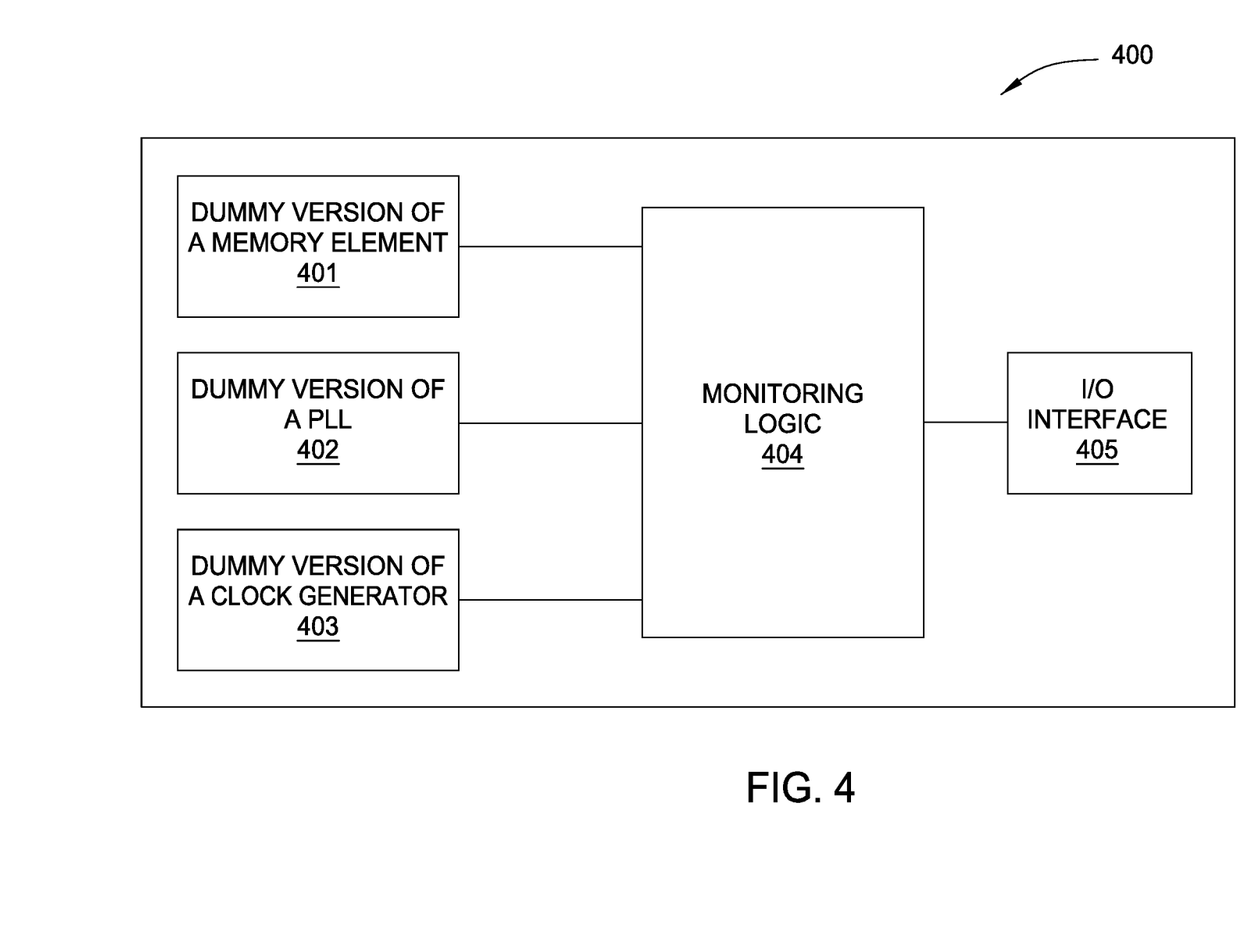
FIG. 4 illustrates an IC, according to another embodiment herein.

FIG. 4 illustrates an IC 400 including multiple dummy circuits, according to one embodiment herein. As shown in FIG. 4, the IC 400 includes multiple dummy circuits, e.g., the dummy version of a memory element 401, the dummy version of a PLL 402 and the dummy version of a clock generator 403. In the IC 400, each of the dummy circuits is a dummy version of a corresponding functional circuit. That is, the IC 400 also includes a functional memory element, a functional PLL and a functional clock generator (not shown in FIG. 4 for simplicity of illustration). The IC 400 operates the functional circuits and the dummy version of the functional circuits in parallel, as explained above. Output signals of the dummy circuits are input to the monitoring logic 404. In one embodiment, the monitoring logic 404 includes selectors and/or comparing logic, similarly as described above. The monitoring logic 404 monitors whether an EM event has occurred in any of the dummy circuits. Upon the monitoring logic 404 detects that an EM event occurs in any of the dummy circuits, the monitoring logic 404 generates and sends a warning signal to the I/O interface 405 indicating that the EM event has occurred in one of the dummy circuits or in the IC 400.

In one embodiment, the dummy circuit can be placed near or in a hot spot of the IC. For example, the PLL is more sensitive to EM events than other circuits in the IC due to the PLL's higher operating frequency. Thus, the PLL is a hot spot of the IC that is more likely to experience EM events. Therefore, a dummy version of the PLL can be placed close to or inside the PLL (or a hot spot in the IC). In another embodiment, the dummy circuit can be placed near the edge of the IC. Placing the dummy circuit near the edge of the IC helps to model the temperature effects that cause the EM events.

Although the embodiments described above are used in analog ICs, the method described herein can be used in digital ICs in a similar way, as understood by an ordinary person in the art.

While the foregoing is directed to embodiments of the present invention, other and further embodiments of the invention may be devised without departing from the basic scope thereof, and the scope thereof is determined by the claims that follow.

What is claimed is:

1. An integrated circuit, comprising:
    a functional circuit comprising a plurality of components and configured according to a first value of a parameter related to electromigration (EM) tolerance;
    a dummy version of the functional circuit comprising the plurality of components and configured according to a second value of the parameter, wherein the second value causes the dummy version of the functional circuit to be more sensitive to an EM event than the functional circuit;
    logic coupled between the dummy version of the functional circuit and an I/O interface of the integrated circuit, wherein the logic is configured to:
        upon determining that the EM event occurs in the dummy version of the functional circuit, assert a signal at the I/O interface indicating that the EM event has occurred in the dummy version of the functional circuit.

2. The integrated circuit of claim 1, wherein the parameter comprises a width of metal lines and vertical interconnect accesses (VIAs) connecting the plurality of components.

3. The integrated circuit of claim 1, wherein the parameter comprises a number of transistor contacts in the functional circuit.

4. The integrated circuit of claim 1, wherein the functional circuit includes the dummy version of the functional circuit.

5. The integrated circuit of claim 1, wherein the logic is further configured to select one or more of the plurality of components in the dummy version of the functional circuit to determine whether the EM event occurs in the dummy version of the functional circuit.

6. The integrated circuit of claim 1, wherein the functional circuit comprises a phase lock loop (PLL) and the dummy version of the functional circuit comprises a dummy version of the PLL.

7. The integrated circuit of claim 1, wherein the integrated circuit comprises dummy versions of multiple functional circuits.

8. An electromigration (EM) monitor, comprising:
    a dummy version of a functional circuit comprising a plurality of components in an integrated circuit, wherein the functional circuit is configured according to a first value of a parameter related to EM tolerance, wherein the dummy version of the functional circuit is configured according to a second value of the parameter, and wherein the second value causes the dummy version of the functional circuit to be more sensitive to an EM event than the functional circuit;
    logic coupled between the dummy version of the functional circuit and an I/O interface of the integrated circuit, wherein the logic is configured to:
        upon determining that the EM event occurs in the dummy version of the functional circuit, assert a signal at the I/O interface indicating that the EM event has occurred in the dummy version of the functional circuit.

9. The EM monitor of claim 8, wherein the parameter comprises a width of metal lines and vertical interconnect accesses (VIAs) connecting the plurality of components.

10. The EM monitor of claim 8, wherein the parameter comprises a number of transistor contacts in the functional circuit.

11. The EM monitor of claim 8, wherein the functional circuit includes the dummy version of the functional circuit.

12. The EM monitor of claim 8, wherein the logic is further configured to select one or more of the plurality of components in the dummy version of the functional circuit to determine whether the EM event occurs in the dummy version of the functional circuit.

13. The EM monitor of claim 8, wherein the functional circuit comprises a phase lock loop (PLL) and the dummy version of the functional circuit comprises a dummy version of the PLL.

14. The EM monitor of claim 8, wherein the integrated circuit comprises dummy versions of multiple functional circuits.

15. A method, comprising:
- configuring a functional circuit comprising a plurality of components in an integrated circuit (IC) according to a first value of a parameter related to electromigration (EM) tolerance;
- configuring a dummy version of the functional circuit comprising the plurality of components in the IC according to a second value of the parameter, wherein the second value causes the dummy version of the functional circuit to be more sensitive to an EM event than the functional circuit;
- upon determining that the EM event occurs in the dummy version of the functional circuit, asserting a signal indicating that the EM event has occurred in the dummy version of the functional circuit.

16. The method of claim 15, wherein the parameter comprises a width of metal lines and vertical interconnect accesses (VIAs) connecting the plurality of components.

17. The method of claim 15, wherein the parameter comprises a number of transistor contacts in the functional circuit.

18. The method of claim 15, wherein the functional circuit includes the dummy version of the functional circuit.

19. The method of claim 15, further comprising selecting one or more of the plurality of components in the dummy version of the functional circuit to determine whether the EM event occurs in the dummy version of the functional circuit.

20. The method of claim 15, wherein the functional circuit comprises a phase lock loop (PLL) and the dummy version of the functional circuit comprises a dummy version of the PLL.

* * * * *